(12) United States Patent
Citron

(10) Patent No.: US 9,941,436 B2
(45) Date of Patent: Apr. 10, 2018

(54) DUAL GEOMETRY TROUGH SOLAR CONCENTRATOR

(71) Applicant: Jeffrey Michael Citron, Tucson, AZ (US)

(72) Inventor: Jeffrey Michael Citron, Tucson, AZ (US)

( * ) Notice: Subject to any disclaimer, the term of this patent is extended or adjusted under 35 U.S.C. 154(b) by 13 days.

(21) Appl. No.: 14/162,320

(22) Filed: Jan. 23, 2014

(65) Prior Publication Data

US 2015/0207007 A1 Jul. 23, 2015

Related U.S. Application Data

(63) Continuation-in-part of application No. 13/337,206, filed on Dec. 26, 2011, now abandoned.

(51) Int. Cl.
*H01L 31/054* (2014.01)
*H02S 40/22* (2014.01)
*F24J 2/10* (2006.01)

(52) U.S. Cl.
CPC .......... *H01L 31/0547* (2014.12); *H02S 40/22* (2014.12); *F24J 2002/109* (2013.01); *Y02E 10/52* (2013.01)

(58) Field of Classification Search
CPC ......... F24J 2002/1004; F24J 2002/1009; F24J 2002/1014; F24J 2002/1019; F24J 2002/1023; F24J 2002/1028; F24J 2002/1033; F24J 2002/1038; F24J 2002/108; F24J 2002/1076; F24J 2/12; Y02E 10/45; H01L 31/0547
See application file for complete search history.

(56) References Cited

U.S. PATENT DOCUMENTS

| | | | | |
|---|---|---|---|---|
| 4,173,213 A | * | 11/1979 | Kelly | F24J 2/10 126/604 |
| 4,800,868 A | * | 1/1989 | Appeldorn | F24J 2/1047 126/651 |
| 2010/0205963 A1 | * | 8/2010 | Ammar | 60/641.15 |
| 2011/0017273 A1 | * | 1/2011 | Roach | F24D 11/0221 136/246 |
| 2011/0240094 A1 | * | 10/2011 | Hoffman | E06B 9/264 136/246 |
| 2012/0006405 A1 | * | 1/2012 | Sutin | G02B 5/09 136/259 |
| 2012/0160302 A1 | * | 6/2012 | Citron | 136/248 |
| 2013/0008488 A1 | * | 1/2013 | Holmes et al. | 136/248 |

FOREIGN PATENT DOCUMENTS

| | | | | |
|---|---|---|---|---|
| WO | WO 2009149450 A1 | * | 12/2009 | E06B 9/264 |
| WO | WO-2009149450 A1 | * | 12/2009 | E06B 9/264 |

* cited by examiner

*Primary Examiner* — Devina Pillay
*Assistant Examiner* — Daniel P Malley, Jr.
(74) *Attorney, Agent, or Firm* — Timothy Marc Shropshire; Eric Brandon Lovell; Garrett James O'Sullivan

(57) ABSTRACT

The present invention is a trough shaped solar concentrator and collector having its focal area and receiver located inside the trough structure below the trough aperture and having a unique dual section trough reflector with a combination of different underlying reflector geometries.

5 Claims, 4 Drawing Sheets

DUAL GEOMETRY TROUGH SOLAR CONCENTRATOR

This application is a Continuation-in-part of this inventor's prior filed application Ser. No. 13/337,206, filed Dec. 26, 2011, the entire disclosure of which is incorporated by reference herein.

BACKGROUND OF THE INVENTION

Prior art trough shaped solar concentrators have been based on either curved parabolic reflectors or linear flat strip reflectors arranged in a Fresnel configuration where each strip reflector was mounted at an angle to reflect the sunlight falling on it to the central line focus of the trough. When a receiving element designed to receive the concentrated solar energy and convert it to another type of energy is placed at the line focus of the trough concentrator, the preferred embodiment of most of these concentrators, a concentrating solar collector is achieved. In prior art trough shaped solar collectors the receiving element has been placed at the very top edge, just within the aperture, trough mouth, of the trough, or above the trough opening. While this placement of the receiving element works, greater thermal efficiency, for a receiver designed to convert the solar energy to thermal energy, can be achieved by locating the receiver element further down inside the boundaries of the trough reflector.

SUMMARY OF THE INVENTION

The present invention defines a trough shaped solar concentrator in which the line focus of the concentrator is located down inside the boundaries of the trough reflector along the central axis of the trough concentrator. In addition the physical reflector configuration that makes up the trough structure in preferred embodiments is shown as a combination of two different types of reflector geometries. In these preferred embodiments the lower trough reflector, below the horizontal center line of the receiving element is a linear Fresnel reflector and the upper trough reflector is a linear version of compound parabolic reflector.

Definition of the terms in the title of the present invention may, here, serve to further elucidate the unique nature of this structure and its elements. The term "Compound" in the title refers to two elements of the invention. First it refers to the dual, compound, geometry of the invention which is made up of two different types of reflector geometries. Second it refers to the upper section of the trough reflector geometry which is similar to a trough geometry known in the industry as a compound parabolic reflector, invented some years ago by Roland Winston. While this reflector section is similar to the compound parabolic trough it differs in the present invention in that it is not made of curved reflector sections but of flat reflector sections configured in an underlying compound parabolic shape. The term "Linear" refers to several characteristics of the present invention. First and foremost, it refers to the basic flat geometry of all the reflector elements in the present invention. All reflectors both in the lower section and the upper section are flat. There are no curved reflectors in this invention, a fact that should keep the cost of production low. Second the term "Linear" refers to the underlying V structure on which the trough reflectors are mounted which can be produced from readily available straight linear materials. The term "V" refers to the underlying V shape of the trough structure that supports the reflectors. The term "Fresnel-Parabolic" refers to the dual nature of the two types of reflectors incorporated in the present invention. And, of course "Trough Solar Concentrator" refers to the category of device to which the present invention belongs.

In summary the unique aspects of the present invention are the placement of the line focus of the concentrator further down in the trough than in prior trough concentrators and the use of two different reflector geometries in this trough concentrator.

Further aspects of the invention will become apparent from consideration of the drawings and the ensuing description of preferred embodiments of the invention. A person skilled in the art will realize that other embodiments of the invention are possible and that the details of the invention can be modified in a number of respects, all without departing from the inventive concept. Thus, the following drawings and description are to be regarded as illustrative in nature and not restrictive.

DETAILED DESCRIPTION OF THE INVENTION

Figure 1:
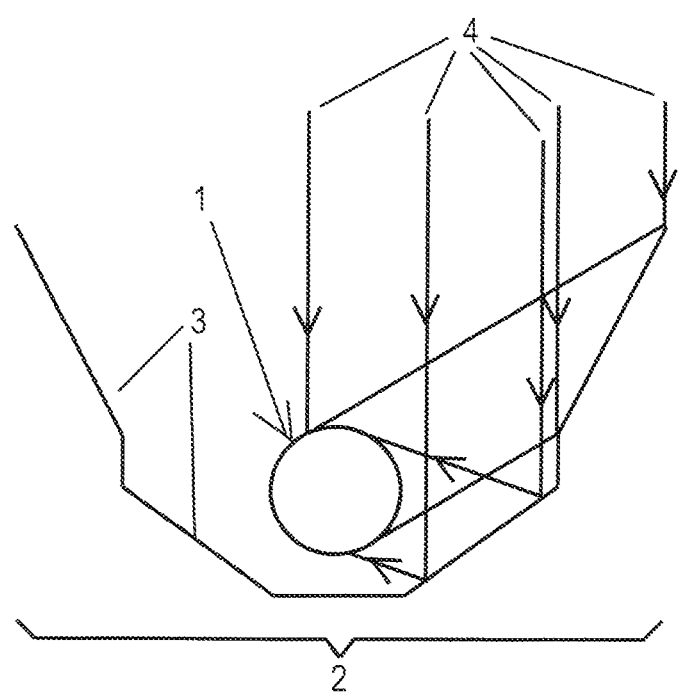
FIG. 1 is a basic cross-sectional drawing of the original conception of this invention showing a trough shaped concentrating collector with Fresnel reflectors and the receiver down inside the trough structure.

FIG. 1 shows the basic conception of the present invention. The trough shown in FIG. 1 has minimal concentration ratio on the receiver tube 1. The principal is here illustrated that the receiver 1 is located down inside the trough structure 2 on its center line between the trough sides which in this illustration are made of reflectors 3. The principle of operation is here shown that light rays 4 are reflected by reflectors 3 to concentrate the incident solar radiation passing thru the trough aperture onto the receiving tube 1. This drawing and invention of the trough with the receiver element down in the trough structure was originally disclosed in this inventors prior filed patent application Ser. No. 13/337,206, filed Dec. 26, 2011.

Figure 2:
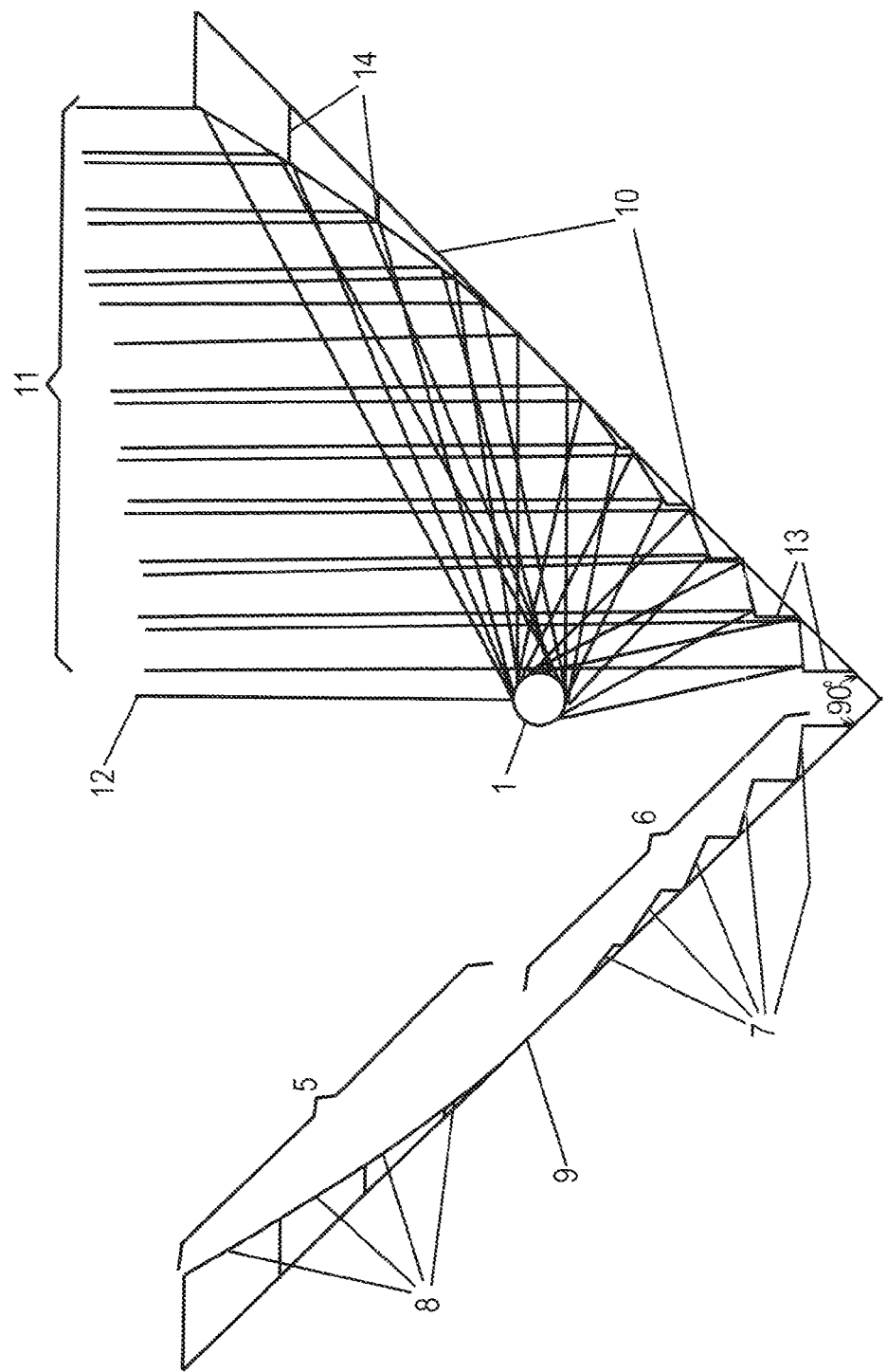
FIG. 2 is a cross-sectional drawing of the preferred embodiment of the present invention as a concentrating solar collector with a round receiver tube for conversion of the solar energy to thermal energy and showing the receiver tube down inside the trough structure and showing different geometric configurations for the reflectors on the trough sides above and below the receiver.

FIG. 2 shows the present invention in a much expanded form with a higher concentration ratio. The basic object of the trough concentrator with the receiver down in the trough structure is to achieve light concentration on the receiver from above as well as from below and on the sides as in prior art trough concentrators.

Analysis showed that in order to accomplish this with flat reflectors, a different reflector geometry is required for the trough upper reflector section 5 above the receiver in the trough than the lower reflector section 6 below the receiver in the trough. The lower reflector section 6 of the present invention is a Fresnel reflector using flat reflectors 7, a configuration that has previously been shown by this inventor and others. Analysis showed that due to shadowing of one reflector by others this configuration is not suitable for the upper reflector section 5. The present invention, therefore, employs flat reflectors 8 in a configuration that approximates a parabolic curve for reflector section 5. Reflector 9 is a flat reflector that reflects incident light on the side of the receiver. Reflector 9 may be mounted on the V shaped sides 10 that support the upper and lower reflector sections 5 and 6 or may actually be polished sections of those side support structures.

It is here to be noted that the side supports 10 which form the underlying V shape of the structural support for the reflectors may be flat panels or a lattice structure as previously shown by this inventor. It is also here to be noted that side supports 10 are shown as straight linear members because it is considered this will keep the cost of production low but this is not a requirement of the present invention whose nature is the combination of upper and lower reflector geometries and the disposition of the receiver down inside the trough structure.

The principle of operation is illustrated in FIG. 2 by light rays 11 which are reflected by upper reflector sections 5 and 6 and side reflector 9 onto receiver 1 and by light ray 12 which is directly incident upon receiver 1. Observation of the drawing will show that light from reflector sections 5 and 6 concentrate solar energy upon receiver 1 from above, below and the side. In comparison to prior art trough concentrating collectors this should increase the thermal efficiency of conversion from solar energy to heat. It is obvious from an examination of FIG. 2 that only direct solar radiation that is parallel to the troughs central axis is reflected onto the receiver and thus this concentrator like most other trough solar concentrators must track the suns' image across the sky in at least one direction, either in elevation, North/South, or azimuth, East/West.

Vertical supports 13 and horizontal supports 14 are non-reflective support members for the reflectors 7 and 8 in lower and upper reflector sections 6 and 5 respectively. Vertical supports 13 in lower reflector section 6 are oriented parallel to incoming solar radiation.

Figure 3:
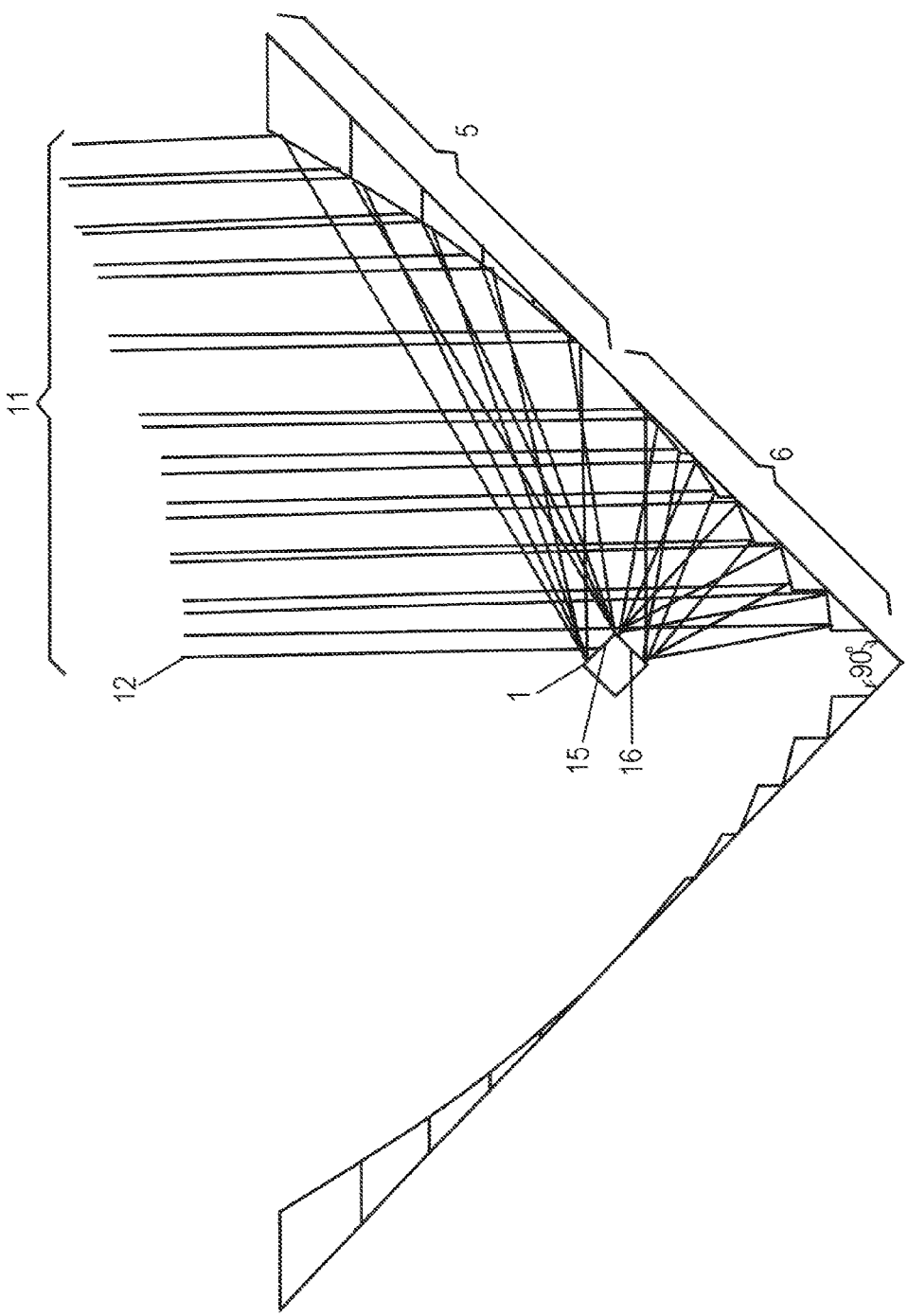
FIG. 3 is a cross-sectional drawing of the concentrating solar collector of this invention showing a square cross-section receiver tube for mounting solar cells upon and incorporating the elements of the receiver tube down inside the trough structure and dual reflector geometries above and below the receiver.

FIG. 3 shows a cross-sectional representation of the present invention with a square cross-section tube as the receiver 1.

The square tube is particularly well suited to having photovoltaic cells mounted on its sides. Examination of the interaction of the ray field 11 in this drawing with the trough reflector sections shows that rays falling on the upper reflector section 5 are concentrated upon side 15 of the square receiver tube while rays falling on the lower reflector section 6 are concentrated upon side 16 of the receiver tube. Thus, it can be seen that the concentration ratio of solar energy upon the solar cells on each side of the square receiver tube is derived from its corresponding upper or lower side reflector section. Direct radiation, ray 12, falls only on the upper side 15 of the square receiver tube.

Solar collectors concentrating sun light upon solar cells require some means of removing excess heat that would otherwise damage the cells. To this end, in this embodiment of the present invention, a heat transfer fluid can be circulated through the center of the square receiver tube 1. The heat collected in this fluid may then be employed for a useful application. Thus, this embodiment of this invention is a Hybrid Concentrating Photovoltaic and Thermal, CPV/T, collector. Because of the high solar cell surface area to heat transfer tube cross-sectional area the thermal efficiency of this embodiment of the invention should be considerably higher than other CPV/T collector designs.

Figure 4:
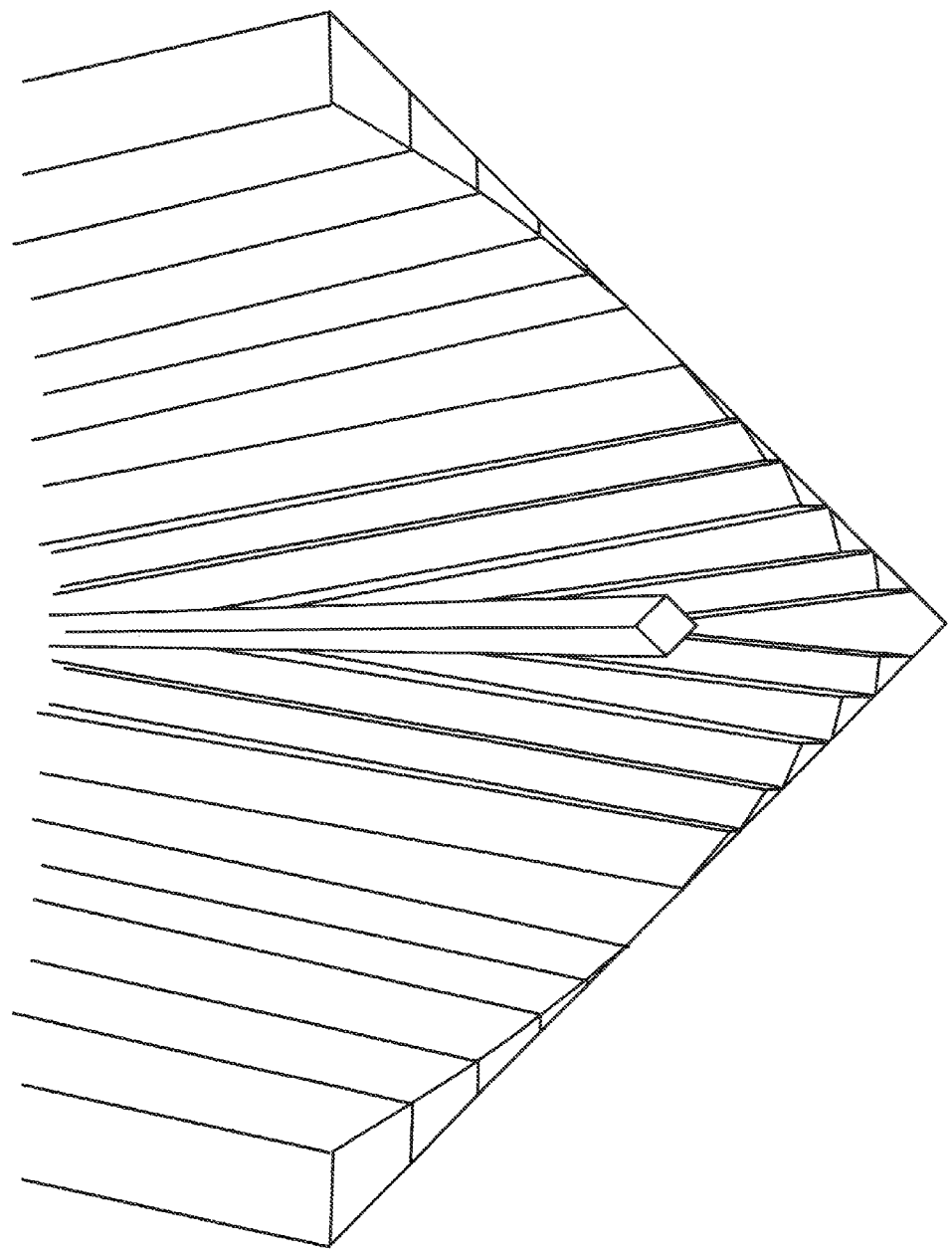
FIG. 4 is a perspective view of the embodiment shown in FIG. 3.

FIG. 4 is a perspective drawing of the embodiment of the present invention showing the square receiver tube.

I claim:

1. A dual-geometry solar concentrator having a lower reflector section and an upper reflector section, said lower reflector section comprising:
   a. a plurality of reflectors having only flat linear reflective surfaces, the reflectors collectively arranged in the shape of a linear trough with an underlying V shape, said reflectors angled to create a Fresnel reflector; and
   b. a vertical support for each reflector, creating a stepped architecture of the Fresnel reflector, said supports being disposed parallel to incoming solar radiation that is parallel to a central axis of the concentrator, wherein the Fresnel reflector reflects and concentrates the incoming solar radiation to a central focal area disposed upon the central axis of the concentrator, the central focal area being positioned below an uppermost edge of the upper reflector section; and
   said upper reflector section comprising a plurality of only flat linear reflectors disposed edge to edge along a rise of the upper reflector section, said reflectors angled to collectively reflect and concentrate the incoming solar radiation to the central focal area.

2. The solar concentrator of claim 1, further comprising a solar energy receiving element disposed at the central focal area, wherein the receiving element converts the concentrated solar radiation to another form of energy.

3. The solar concentrator of claim 2, wherein the solar energy receiving element is a tube of cross-section, the tube containing a fluid that is circulated through the tube, wherein the solar radiation entering the concentrator is absorbed by the tube and converted to heat energy that is transferred to the fluid circulating through the tube.

4. The solar concentrator of claim 2, wherein the solar energy receiving element is a structure of cross-section comprising photovoltaic cells that receive and convert the solar radiation entering the concentrator into electrical energy.

5. The solar concentrator of claim 4, wherein the solar energy receiving element is a tube of square cross-section disposed such that an axis from corner to corner of said square tube is located upon the central axis of the concentrator, wherein the photovoltaic cells are mounted on a plurality of outer surfaces of the tube, wherein the reflectors of the lower reflector section concentrate solar energy upon one or more lower facing surfaces of the square tube, and wherein the reflectors of the upper reflector section concentrate solar energy upon one or more upper facing surfaces of the square tube, wherein a fluid is circulated through said tube to cool said photovoltaic cells and harvest thermal energy.

* * * * *